United States Patent [19]

Kadokawa

[11] Patent Number: 5,099,483
[45] Date of Patent: Mar. 24, 1992

[54] DEVICE FOR CORRECTING ERRORS BY A LONG-DISTANCE CODE

[75] Inventor: Yuichi Kadokawa, Tokyo, Japan

[73] Assignee: Ricoh Company, Ltd., Tokyo, Japan

[21] Appl. No.: 450,684

[22] Filed: Dec. 14, 1989

[30] Foreign Application Priority Data

Dec. 19, 1988 [JP] Japan .................. 63-318466

[51] Int. Cl.⁵ .................. G06F 11/10; H03M 13/00
[52] U.S. Cl. .................. 371/37.1; 371/37.6
[58] Field of Search .................. 371/37.1, 37.2, 37.6, 371/38.1, 39.1

[56] References Cited

U.S. PATENT DOCUMENTS

| | | | |
|---|---|---|---|
| 3,568,148 | 3/1971 | Clark, Jr. .................. | 371/37.1 |
| 4,105,999 | 8/1978 | Nakamura .................. | 371/37.6 |
| 4,328,582 | 5/1982 | Battail et al. .................. | 371/37.1 |
| 4,422,156 | 12/1983 | Sano .................. | 364/724.17 |
| 4,494,234 | 1/1985 | Patel .................. | 371/37.6 |
| 4,556,977 | 12/1985 | Olderdissen et al. .................. | 371/37.1 |
| 4,633,470 | 12/1986 | Welch et al. .................. | 371/37.1 |
| 4,937,829 | 6/1990 | Kadokawa .................. | 371/37.1 |
| 4,939,733 | 7/1990 | Furutani .................. | 371/37.1 |

Primary Examiner—Jerry Smith
Assistant Examiner—Phung My Chung
Attorney, Agent, or Firm—Cooper & Dunham

[57] ABSTRACT

A device for correcting errors of a long-distance code, when decoding a long-distance code capable of correcting errors up to maximum t words of which one word is composed of w bits, for obtaining a coefficient of each term of an error-position polynomial by setting data words $A_{(i+j-2)}$ to each element $q_{i,j}$ of a matrix having t rows and $(t+1)$ columns, where $1 \leq i \leq t$, $1 \leq j \leq t+1$, $A_0$ to $A_{2t-1}$ represent syndromes or error positions, and by performing a left-hand elementary transformation over the matrix in order to obtain each coefficient of each term of the error-position polynomial or error patterns from syndromes has an error position calculating device for obtaining the error positions by utilizing a coefficient calculating circuit of the error-position polynomial and an error pattern calculating circuit.

1 Claim, 5 Drawing Sheets

Fig. 2

|  | | ADDRESS | | | | |
|---|---|---|---|---|---|---|
|  | | #1 | #2 | #3 | #4 | #5 |
| BIT WIDTH | 1~8 | $a_{1.1}$ | $a_{1.2}$ | $a_{1.3}$ | $a_{1.4}$ | $a_{1.5}$ |
|  | 9~16 | $a_{2.1}$ | $a_{2.2}$ | $a_{2.3}$ | $a_{2.4}$ | $a_{2.5}$ |
|  | 17~24 | $a_{3.1}$ | $a_{3.2}$ | $a_{3.3}$ | $a_{3.4}$ | $a_{3.5}$ |
|  | 25~32 | $a_{4.1}$ | $a_{4.2}$ | $a_{4.3}$ | $a_{4.4}$ | $a_{4.5}$ |

DEVICE FOR CORRECTING ERRORS BY A LONG-DISTANCE CODE

BACKGROUND OF THE INVENTION

1. Field of the Invention

This invention relates to a device for correcting errors by a long-distance code used in information storage on optical disks, magnetic disks or the like, or in data communication.

Error-correcting codes for correcting multiple words (hereinafter referred to as "a long-distance code"), such as BCH codes and Read-Solomon codes, are being used in information storage on optical disks, magnetic disks or the like, or in data communication, etc.

The present invention relates to a device for correcting errors by a long-distance code as mentioned above by decoding them. This invention is an improvement on an error-correcting device disclosed in Japanese Patent Application No. 63-218443 filed, by the applicant of the present patent application and laid open on Mar. 7, 1990 in KOKAI Application No. 2-67826. The improvement consists in diminution in device size and augmentation in speed.

2. Description of the Related Art

To correct errors in multiple words by means of a long-distance code such as BCH codes and Read-Solomon codes, it is necessary to generate syndromes from the received data so as to obtain the coefficients of an error-position polynomial. The error-position polynomial is a polynomial the root of which consists of a value that corresponds to the error position. By obtaining the respective coefficients of the error-position polynomial, the data position where the error has occurred can be calculated.

In the following explanation, a Read-Solomon code on a Galois field GF ($2^8$) will be taken as an example. The code is capable of 4-word correction (t=4) (1 word is composed of 8 bits, and 255 words form 1 block).

Generally, an error-position polynomial $\sigma(x)$ can be defined by the following equation:

$$\sigma(x) = X^4 + \sigma_3 X^3 + \sigma_2 X^2 + \sigma_1 X + \sigma_0 \tag{1}$$

There exists the following relationship between the coefficients $\sigma_0$ to $\sigma_3$ in the above equation (1) and syndromes $S_0$ to $S_7$:

$$\begin{bmatrix} S_3 & S_2 & S_1 & S_0 \\ S_4 & S_3 & S_2 & S_1 \\ S_5 & S_4 & S_3 & S_2 \\ S_6 & S_5 & S_4 & S_3 \end{bmatrix} \begin{bmatrix} \sigma_3 \\ \sigma_2 \\ \sigma_1 \\ \sigma_0 \end{bmatrix} = \begin{bmatrix} S_4 \\ S_5 \\ S_6 \\ S_7 \end{bmatrix} \tag{2}$$

By transforming this matrix by transposing the right-hand side member of the equation (2) to the left-hand side, the following equation (3) is obtained:

$$\begin{bmatrix} S_0 & S_1 & S_2 & S_3 & S_4 \\ S_1 & S_2 & S_3 & S_4 & S_5 \\ S_2 & S_3 & S_4 & S_5 & S_6 \\ S_3 & S_4 & S_5 & S_6 & S_7 \end{bmatrix} \begin{bmatrix} \sigma_0 \\ \sigma_1 \\ \sigma_2 \\ \sigma_3 \\ 1 \end{bmatrix} = 0 \tag{3}$$

Further, by effecting left-hand elementary transformation on the above equation (3), the following equation (4) is obtained:

$$\begin{bmatrix} 1 & 0 & 0 & 0 & a_0 \\ 0 & 1 & 0 & 0 & a_1 \\ 0 & 0 & 1 & 0 & a_2 \\ 0 & 0 & 0 & 1 & a_3 \end{bmatrix} \begin{bmatrix} \sigma_0 \\ \sigma_1 \\ \sigma_2 \\ \sigma_3 \\ 1 \end{bmatrix} = 0 \tag{4}$$

From this equation (4), the coefficients $\sigma_0$ to $\sigma_3$ can be obtained as the following equations (5):

$$\left. \begin{array}{l} \sigma_0 = a_0 \\ \sigma_1 = a_1 \\ \sigma_2 = a_2 \\ \sigma_3 = a_3 \end{array} \right\} \tag{5}$$

The following relationship exists between the error patterns $Y_1$ to $Y_4$ and the syndromes $S_0$ to $S_7$:

$$\begin{bmatrix} 1 & 1 & 1 & 1 \\ V_0 & V_1 & V_2 & V_3 \\ V_0^2 V_1^2 V_2^2 V_3^2 \\ V_0^3 V_1^3 V_2^3 V_3^3 \end{bmatrix} \begin{bmatrix} Y_1 \\ Y_2 \\ Y_3 \\ Y_4 \end{bmatrix} = \begin{bmatrix} S_0 \\ S_1 \\ S_2 \\ S_3 \end{bmatrix} \tag{6}$$

where $V_0$ to Vhd 3 represent the error positions obtained from the equation (1) on the basis of the above-mentioned coefficients $\sigma_0$ to $\sigma_3$.

By effecting left-hand side elementary transformation on this equation (6) as in the case of the above equation (2), the following equation (7) can be obtained:

$$\begin{bmatrix} 1 & 0 & 0 & 0 & b_0 \\ 0 & 1 & 0 & 0 & b_1 \\ 0 & 0 & 1 & 0 & b_2 \\ 0 & 0 & 0 & 1 & b_3 \end{bmatrix} \begin{bmatrix} Y_1 \\ Y_2 \\ Y_3 \\ Y_4 \\ 1 \end{bmatrix} = 0 \tag{7}$$

From this equation (7), the error patterns $Y_1$ to $Y_4$ can be obtained as the following equation (8):

$$\left. \begin{array}{l} Y_1 = b_0 \\ Y_2 = b_1 \\ Y_3 = b_2 \\ Y_4 = b_3 \end{array} \right\} \tag{8}$$

As is apparent from the above equations (4) and (8), both the coefficients $\sigma_0$ to $\sigma_3$ of the error-position polynomial and the error patterns $Y_1$ to $Y_4$ can be obtained by effecting left-hand side elementary transformation on the given matrix.

Thus, in the construction of conventional long-distance code error correcting devices, the coefficients $\sigma_0$ to $\sigma_3$ of the error-position polynomial and the error patterns $Y_1$ to $Y_4$ can be obtained by effecting left-hand side elementary transformation on the given matrix.

Generally, in effecting correction with a long-distance code, the following five steps of followed:
(1) Generating syndromes;
(2) Obtaining the error-position polynomial;
(3) Obtaining the error positions;
(4) Obtaining the error patterns; and
(5) Correcting the errors.

In error-correcting devices, steps (2) and (4) are effected by an integrally formed circuit for obtaining the error-position polynomial and the error pattern, thereby attaining diminution in circuit size and augmentation in speed.

Thus, one problem with error-correcting devices is that the circuit for performing step (3), i.e., the circuit for locating the error position, has to be separately provided as external equipment.

SUMMARY OF THE INVENTION

This invention has been made in view of the above problem. It is accordingly the object of this invention to provide a device for correcting errors of a long-distance code in which the series of procedures of steps (2) to (4) can be performed in the same circuit.

The object of this invention can be achieved by a device for correcting errors of a long-distance code, when decoding errors of a long-distance code, when decoding a long-distance code capable of correcting errors up to maximum t words of which one word is composed of w bits, for obtaining a coefficient of each term of an error-position polynomial by setting data words $A_{(i+j-2)}$ to each element $q_{i,j}$ of a matrix having t rows and (t+1) columns, where $1 \leq i \leq t$, $1 \leq j \leq t+1$, $A_0$ to $A_{2t-1}$ represent syndromes or error positions, and by performing a left-hand elementary transformation over the matrix in order to obtain each coefficient of each term of the error-position polynomial or error patterns from syndromes has error position calculating device for obtaining the error positions by utilizing a coefficient calculating circuit of the error-position polynomial and an error pattern calculating circuit.

In accordance with this invention, error positions are obtained by utilizing the coefficient calculating circuit of the error-position polynomial and the error pattern calculating circuit, so that the three operations of error-position polynomial calculation, error-position calculation, and error pattern calculation can be performed with one circuit, thus making it possible to further miniaturize devices of this type. Furthermore, since all calculating operations are performed in one and the same circuit, the device of this invention requires, unlike conventional devices, no inter-device-data-transmission time, thereby making it possible to attain a further augmentation in speed.

BRIEF DESCRIPTION OF THE DRAWINGS

FIG. 2 is a diagram showing an address arrangement in the RAM 1 of the device shown in FIG. 1;

DETAILED DESCRIPTION OF THE PREFERRED EMBODIMENTS

A error-correcting device will be first described so that the present invention may be better understood.

Figure 1:
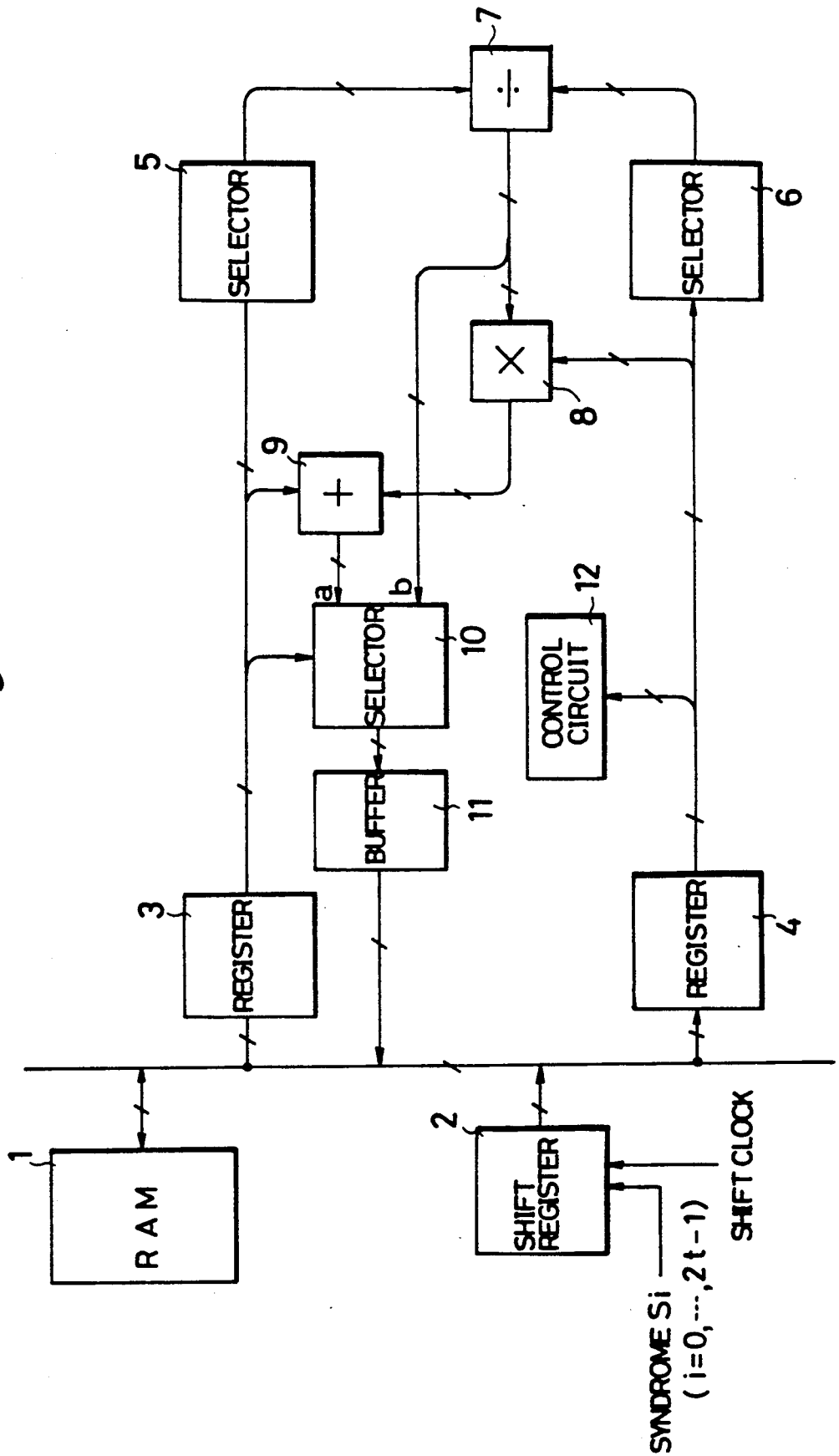
FIG. 1 is a block diagram showing the configuration of a error-correcting device.

FIG. 1 shows the configuration of the long-distance code error correcting device disclosed in Japanese Patent Application No. 63-218443 filed by the applicant of the present patent application and laid open on Mar. 7, 1990 in KOKAI Application No. 2-67826. In this error-correcting device, the coefficients $\sigma_0$ to $\sigma_3$ of the error-position polynomial and the error patterns $Y_1$ to $Y_4$ are obtained by effecting a left-hand-side elementary transformation on the matrix described above.

Referring to FIG. 1, the error-correcting device shown includes an RAM 1 for storing data words corresponding to the respective elements of the matrix on which the left-hand-side elementary transformation is to be performed, a shift register 2 for latching supplied syndromes, registers 3, 4 for latching data words in units of columns extracted from memory for the purpose of effecting the left-hand-side elementary transformation, selectors 5, 6 for selecting the data words for the left-hand-side transformation from among the data words in units of columns latched by the registers 3, 4, an divider 7, a multiplier 8, an adder 9, a buffer 11, a selector 10 for selectively transmitting the calculation results from the divider 7 or the adder 9 to the buffer 11, and a control circuit 12 for controlling the processing operation.

FIG. 2 shows the address arrangement in the data-word-storing RAM 1 shown in FIG. 1. In this example, the RAM stores a matrix having four rows and five columns; the matrix is expressed as follows:

$$\begin{bmatrix} a_{1,1} & a_{1,2} & a_{1,3} & a_{1,4} & a_{1,5} \\ a_{2,1} & a_{2,2} & a_{2,3} & a_{2,4} & a_{2,5} \\ a_{3,1} & a_{3,2} & a_{3,3} & a_{3,4} & a_{3,5} \\ a_{4,1} & a_{4,2} & a_{4,3} & a_{4,4} & a_{4,5} \end{bmatrix} \quad (9)$$

Each element $a_{i,j}$ is composed of 8 bits; the respective columns of the matrix are in one-to-one correspondence with addresses #1 to #5 in the RAM 1. Therefore, by accessing through designation of one of the addresses #1 to #5 of this RAM 1, the data words in the expression (9) can be read/written in units of columns.

Generally, when the diagonal elements become 0 in effecting left-hand elementary transformation on a matrix, it is necessary to replace the row concerned with some other row involving no 0-diagonal element before obtaining the values of the next column. However, in the case where, as described above, reading and writing is effected in units of columns with the addresses of the RAM 1 being in one-to-one correspondence with the respective columns of the matrix, such inter-row replacement cannot be effected directly. In view of this, the device shown in FIG. 1 calculates the value of the next column directly from the respective column values of the row to be replaced, instead of effecting inter-row replacement.

That is, suppose $a_{1,1}=0$ and $a_{2,1}\neq 0$ in the above matrix (9), and the second column is selected for the replacement of the first column $a_{1,1}$ to $a_{4,1}$ when effecting left-hand elementary transformation on the first column involving a 0-diagonal element, the respective values of the second column $a_{1,2}$ to $a_{4,2}$ when effecting left-hand elementary transformation on the first column are obtained as follows:

$$a_{1,2} = a_{2,2} + a_{2,1} \times a_{1,1} + a_{1,2}$$
$$a_{2,2} = a_{2,2} + a_{2,1}$$
$$a_{3,2} = a_{2,2} + a_{2,1} \times a_{3,1} + a_{3,2}$$
$$a_{4,2} = a_{2,2} + a_{2,1} \times a_{4,1} + a_{4,2} \quad (10)$$

Thus, a similar processing is performed when effecting left-hand elementary transformation on each column, thus effecting the left-hand elementary transformation of the matrix.

Next, the operation of obtaining the coefficients $\sigma_0$ to $\sigma_3$ of the error-position polynomial (1) by means of the circuit shown in FIG. 1 will be described.

First, the syndromes $S_0$ to $S_7$ supplied are stored in the RAM 1 in the form of a matrix in accordance the following matrix (11):

$$\begin{bmatrix} S_0 & S_1 & S_2 & S_3 & S_4 \\ S_1 & S_2 & S_3 & S_4 & S_5 \\ S_2 & S_3 & S_4 & S_5 & S_6 \\ S_3 & S_4 & S_5 & S_6 & S_7 \end{bmatrix} \quad (11)$$

Next, in order to obtain the coefficients $\sigma_0$ to $\sigma_3$, the left-hand elementary transformation of the matrix (11) stored in the RAM 1 is started. To make the explanation easier to understand, the following specific values will be adopted here for the syndromes $S_0$ to $S_7$:

S0 = 0
S1 = 15
S2 = 85
S3 = 115
S4 = 193
S5 = 115
S6 = 161
S7 = 231

By substituting these syndrome values in the above matrix (11), the following is obtained:

$$\begin{bmatrix} 0 & 15 & 85 & 115 & 193 \\ 15 & 85 & 115 & 193 & 115 \\ 85 & 115 & 193 & 115 & 161 \\ 115 & 193 & 115 & 161 & 231 \end{bmatrix} \quad (12)$$

First, the left-hand elementary transformation of the first column is performed.

That is, the syndromes (0, 15, 85, 115) at the address #1 in the RAM 1 are read and stored in the register 4 to determine as to whether or not the first column includes a 0-diagonal element. If it does, the row for replacement is obtained. In this example, the second row is obtained as the replacement row. Further, the values of the second column (15, 85, 115, 193) are read and stored in the register 3.

The selectors 5 and 6 are set so as to select the values of the second row. The selector 10 is set so as to select the b-side for the elements of the second row and the a-side for the elements of the other rows.

Subsequently, the operation of the above equations (10) is performed by means of the divider 7, the multiplier 8, and the adder 9 using the values of the first row (0, 15, 85, 115) and the second row (15, 85, 115, 193) stored in the above registers 3 and 4, thereby obtaining the values $a_{1,2}$ to $a_{4,2}$ of the second column when left-hand elementary transformation is effected on the first column. The results of this operation are as follows:

$a_{1,2} = 15$
$a_{2,2} = 15$
$a_{3,2} = 115$
$a_{4,2} = 193$

The values of the second column (15, 15, 115, 193) obtained in the above manner are written to the second column of the RAM 1, i.e., the address #2, through the buffer 11. This process is repeated for each column.

When the above process has been executed for the fourth column, the matrix in the RAM 1 has the following contents:

$$\begin{bmatrix} 15 & 15 & 62 & 87 & 64 \\ 0 & 15 & 15 & 107 & 120 \\ 115 & 58 & 101 & 0 & 54 \\ 85 & 87 & 0 & 101 & 15 \end{bmatrix} \quad (13)$$

Accordingly, the values of the fifth column of this matrix (13) give the error positions $\sigma_0$ to $\sigma_3$ as follows:

$\sigma 0 = 64$
$\sigma 1 = 120$
$\sigma 2 = 54$
$\sigma 3 = 15$

As is apparent from the matrix (13), the first to fourth columns in this example are not rewritten in the form of a unit matrix as in equation (4). This is due to the fact that, when obtaining error positions $\sigma_0$ to $\sigma_3$, it is enough for the elements of the fifth column to be known, there being no need to rewrite the elements of a portion constituting a unit matrix.

The error patterns $Y_1$ to $Y_4$ can be obtained in the same manner.

In the following, the described example will be of a Read-Solomon codes on a Galois field GF ($2^8$) which is capable of 4-word correction (t=4) when 1 word consists of 8 bits and 1 block is made up of 255 words.

The error-position polynomial can be defined by the above equation (1). The error position V is a root of this error-position polynomial and can be obtained by substituting the roots therein.

In the above-mentioned case where 1 word consists of 8 bits, there exist 255 roots: $\alpha^0$ to $\alpha^{254}$. Accordingly, the error position V can be obtained by substituting these roots one by one for X in equation (1); that root which causes the value of $\sigma(x)$ to become 0 is what is being searched for.

Thus, the following equations are calculated one by one to find the root which causes the value of $\sigma(x)$ to become 0:

$$\sigma_{(0)} = a^{0.4} + \sigma_3 a^{0.3} + \sigma_2 a^{0.2} + \sigma_2 a^{0.1} + \sigma_0 \quad (14)$$
$$\sigma_{(1)} = a^{1.4} + \sigma_3 a^{1.3} + \sigma_2 a^{1.2} + \sigma_2 a^{1.1} + \sigma_0$$
$$\sigma_{(2)} = a^{2.4} + \sigma_3 a^{2.3} + \sigma_2 a^{2.2} + \sigma_2 a^{2.1} + \sigma_0$$
$$\sigma_{(3)} = a^{3.4} + \sigma_3 a^{3.3} + \sigma_2 a^{3.2} + \sigma_2 a^{3.1} + \sigma_0$$

$$\vdots$$

$$\sigma_{(254)} = a^{254.4} + \sigma_3 a^{254.3} + \sigma_2 a^{254.2} + \sigma_2 a^{254.2} + \sigma_0$$

The root which causes the value of $\sigma(x)$ to be 0 is the error position V. This error-position calculating method is well known in the art as "Chien research".

Since the coefficients $\sigma_0$ to $\sigma_3$ have already been obtained in the manner described above, the above-mentioned error position V can be obtained with the aid of the circuit in the above-described prior-art device by transforming the above equation (14) to the following recursion formulae (15) and (16) and adding an error-position calculating means adapted to repeat the operation of these recursion formulae:

$$\sigma(\sigma^n) = \sigma_{4,n} + \sigma_{3,n} + \sigma_{2,n} + \sigma_{1,n} + \sigma_0 \quad (15)$$

$$\left.\begin{array}{l} \sigma_{4,n} = \alpha^4 \sigma_{4,n-1} \\ \sigma_{3,n} = \alpha^3 \sigma_{3,n-1} \\ \sigma_{2,n} = \alpha^2 \sigma_{2,n-1} \\ \sigma_{1,n} = \alpha^1 \sigma_{1,n-1} \end{array}\right\} \quad (16)$$

The initial conditions for the equations (16) are:

$$\left.\begin{array}{l} \sigma_{4,0} = 1 \\ \sigma_{3,0} = \sigma_3 \\ \sigma_{2,0} = \sigma_2 \\ \sigma_{1,0} = \sigma_1 \end{array}\right\} \quad (17)$$

To calculate the error patterns $Y_1$ to $Y_4$, the powers for the error positions $V_0$ to $V_4$ are required, as is apparent from the equation (6). They can also be obtained from the following recursion formulae (18) and (19):

$$\left.\begin{array}{l} V_n^3 = \alpha^3 \cdot V_{n-1}^3 \\ V_n^2 = \alpha^2 \cdot V_{n-1}^2 \\ V_n^1 = \alpha^1 \cdot V_{n-1}^1 \\ V_n^0 = \alpha^0 \cdot V_{n-1}^0 \end{array}\right\} \quad (18)$$

The initial conditions for the equations (18) are:

$$\left.\begin{array}{l} V_0^3 = 1 \\ V_0^2 = 1 \\ V_0^1 = 1 \\ V_0^0 = 1 \end{array}\right\} \quad (19)$$

An embodiment of this invention will now be described with reference to the attached drawings.

Figure 3:
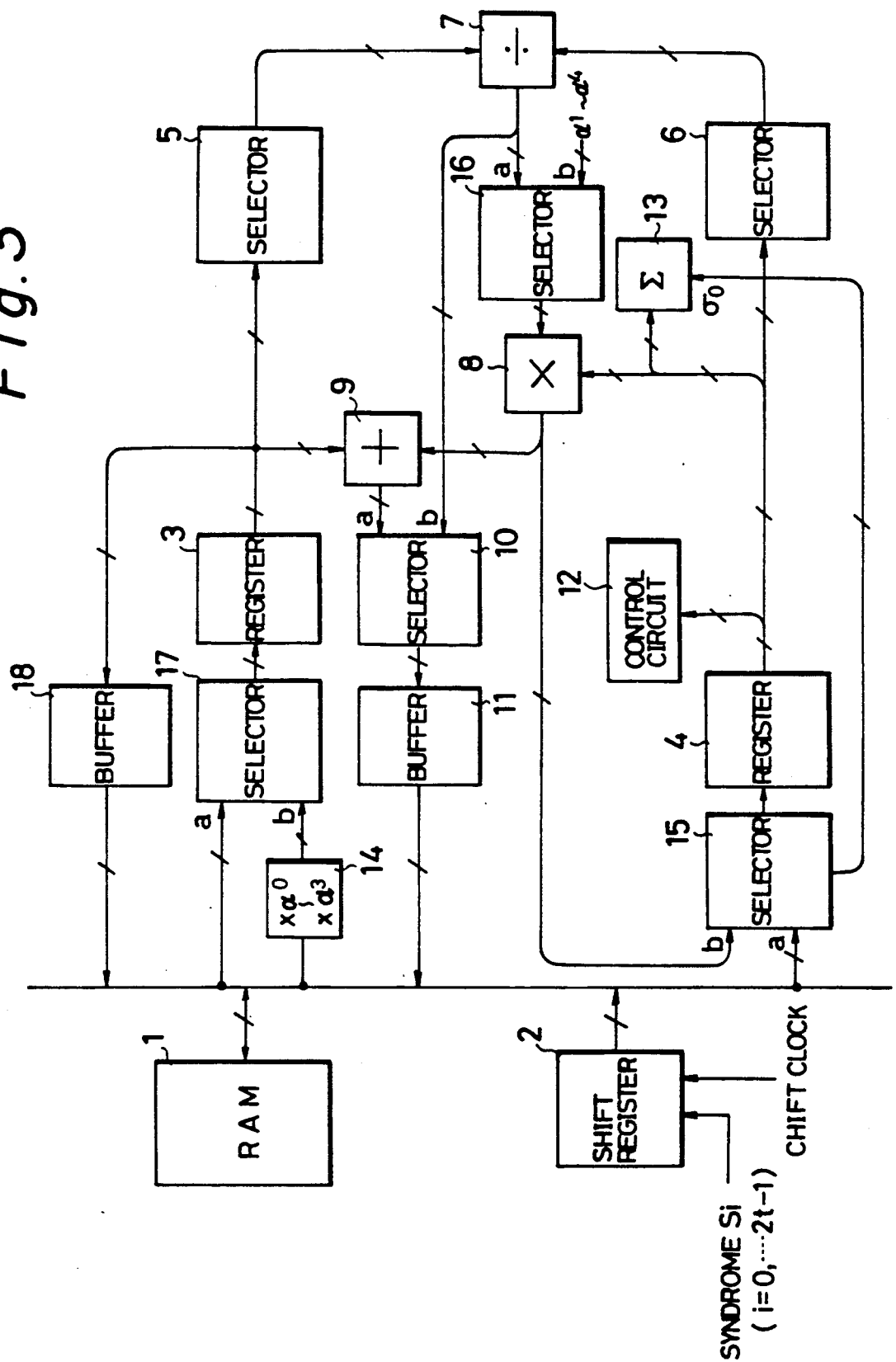
FIG. 3 is a block diagram showing the configuration of an embodiment of this invention.

FIG. 3 shows an embodiment of a device for correcting errors in accordance with this invention. In the following, those components identical to those of FIG. 1 are referred to by the same reference numerals, a description of such components being omitted.

The device of this invention is formed by adding a summing unit 13, a multiplier 14, selectors 15 to 17, and a buffer 18 to the prior-art error-correcting device of FIG. 1.

The unit 13 is a circuit for performing the addition of the terms of the above equation (15), and the multiplier 14 is a multiplication circuit for $\alpha^0$ to $\alpha^3$ in the above equations (18). The register 4 stores $\sigma_{1,n}$ to $\sigma_{4,n}$ of the equations (16), and the register 3 stores $V_n^0$ to $V_n^3$ of the equations (18), the register 4 having the bit configurations shown in FIG. 4a and the register 3 having the bit configurations shown in FIG. 4b, respectively.

Figure 5:
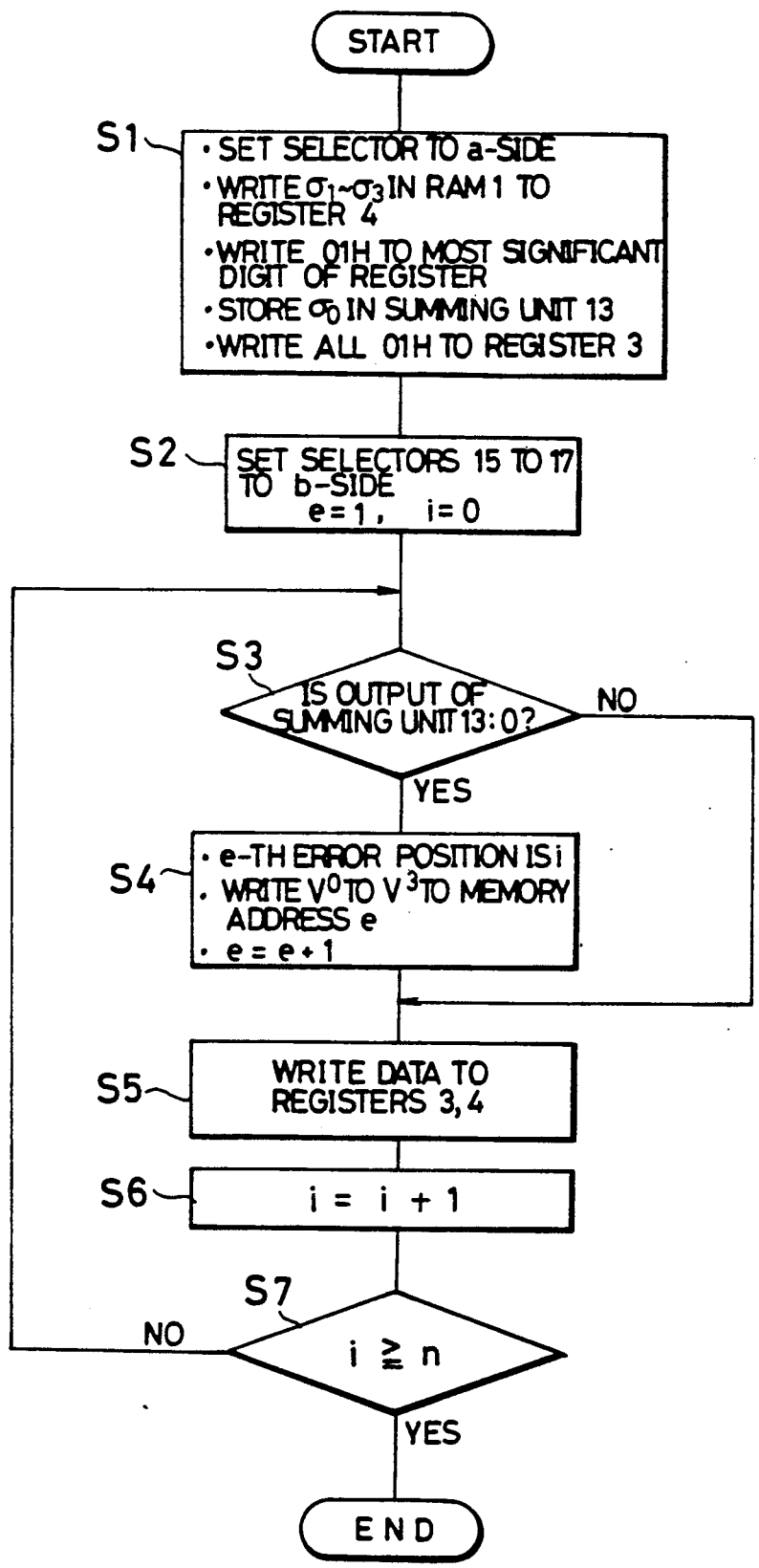
FIG. 5 is a flowchart of the operation of this embodiment.

The operation of the above embodiment will now be described with reference to the flowchart of FIG. 5.

When, in FIG. 3, the selectors 15 to 17 are set to the a-side, the same circuit configuration as that of the prior-art device shown in FIG. 1 results, so that the respective coefficients $\sigma_0$ to $\sigma_3$ of the terms of the error-position polynomial and the error patterns $Y_1$ to $Y_4$ can be obtained in the same manner as in the prior-art device. Thus, in the following, the description of the operation of calculating the coefficients of the error-position polynomial and the error patterns will be omitted. Here, described will be the case where the error position is obtained from the equations (15), (16) and (18).

The initial conditions for the equations (17) and (19) are respectively stored in the RAM 1.

Figure 4:
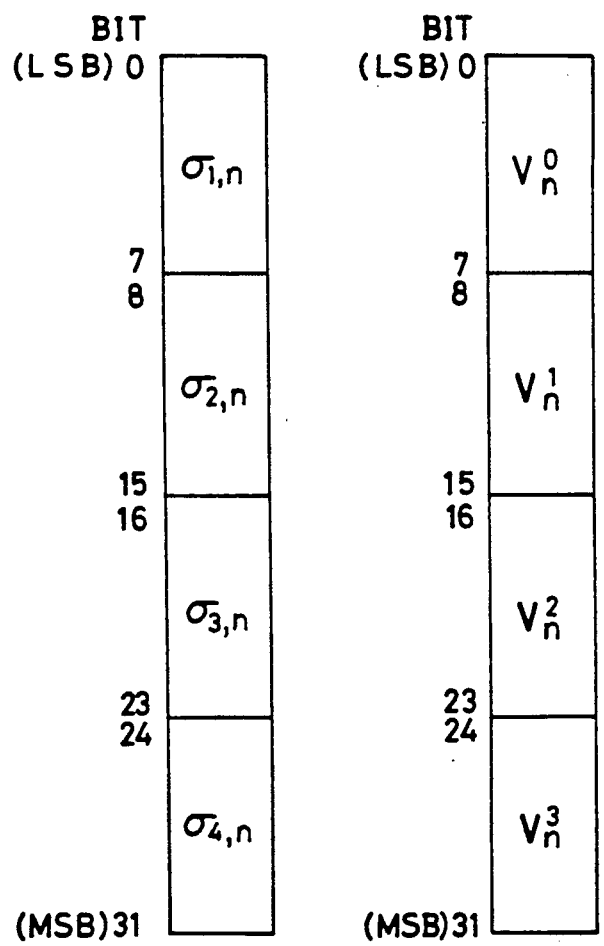
FIGS. 4a and 4b are diagrams showing examples of the register disclosed in the embodiment shown in FIG. 3.

First, in Step [S1], the selector 15 is set to the a-side, and the initial conditions: $\sigma_{1,0}=\sigma_1$, $\sigma_{2,0}=\sigma_2$, and $\sigma_{3,0}=\sigma_3$ for the above equations (17) are written to the register 4 through the selector 15, and $\sigma_{4,0}=1(=01\text{H})$ is written to the most significant digit (FIG. 4a). Since the value of $\sigma_0$ does not change while the Chien search is being conducted, it is directly written to the register in the unit 13.

The selector 17 is set to the a-side, and the initial condition: $V_3^0=V_2^0=V_1^0=V_1^0=1$ (=01H) for the above equation (19) is written to the register 4 (FIG. 4b).

Next, in Step [S2], the selectors 15, 16 and 17 are set to the b-side, and the initialization is effected such that the number of errors e=1 and the loop variable i for repeating the process by the number of words n in one correction sequence is 1.

When the above initialization has been terminated, the calculating operations of the equations (15), (16), and (18) are executed in parallel. In the following, the operation of error-position calculation using the equations (15) and (16) will be first described, and the operation of error-calculation using the equations (18) and (19) will be described afterwards so that the processing operations will be more easily understood.

In Step [S3], the unit 13 performs the summing of $$\sigma_{1,0}=\sigma_1, \sigma_{2,0}=\sigma_2, \sigma_{3,0}=\sigma_3, \sigma_{4,0}=1$$

stored in the register 4 and $\sigma_0$ directly stored in the integrator 13, thereby obtaining $\sigma(\alpha^0)$ in the equation (15). Then, a judgment is made as to whether or not the value of this $\sigma(\alpha^0)$ is 0.

If $\sigma(\alpha^0)\neq 0$, it is decided that no error exists, and the procedure moves on to Step [S5].

If $\sigma(\alpha^0)=0$, the position concerned is judged to be the error position, and the procedure moves on to Step [S4]. Then, the error position i is obtained.

Next, the procedure moves on to Step [S5]. In this step, the multiplier 8 multiplies the above $\sigma_{1,0}$, $\sigma_{2,0}$, $\sigma_{3,0}$, $\sigma_{4,0}$ output from the register 4 by $\alpha^1$ to $\alpha^4$ transmitted from the selector 16 and performs the operation of the equations (16), thereby calculating $\sigma_{1,1}$, $\sigma_{2,1}$, $\sigma_{3,1}$ corresponding to n=1. The multiplication values $\sigma_{1,1}$, $\sigma_{2,1}$, $\sigma_{3,1}$ thus obtained are then stored in the register 4 through the selector 15.

In Step [S6], the loop variable i is incremented by 1, and in Step [S7], a judgment is made as to whether i≧n. Afterwards, the procedure returns to Step [S3], and the processes of Steps [S3] to [S6] are repeated.

The above processes are repeated until the number equal to the number of words n in one correction sequence is attained.

The operation of calculating $V_0^n$ to $V_3^n$ of the error position V on the basis of the equations (18) and (19) is executed as follows:

First, the initial conditions: $V_3^0 32 1(=01H)$, $V_2^0=1$, $V_0^0=1$ are input to the multiplier 14 through the buffer 18, multiplying them by $\alpha^0$ to $\alpha^3$, respectively to execute the calculation of the equations (18). This calculation process is repeated in synchronism with the error-position calculating operation using the above-mentioned unit 13, etc.

When a value obtained through this calculation process corresponds to the error position obtained by means of the above-mentioned unit 13, the multiplier 8, etc., the calculated values of the equations (18) at that time are written to RAM 1 (Step [S4]). This makes it possible to obtain the necessary exponentiations of the error positions $V_0$ to $V_3$ for calculating the error pattern Y simultaneously with the above calculation of the error positions.

What is claimed is:

1. A device for correcting errors of a long-distance code, when decoding a long-distance code capable of correcting errors up to maximum of t words of which one word is composed of w bits, by obtaining a coefficient of each term of an error-position polynomial by setting data words $A_{(i+j-2)}$ to each element $q_{i,j}$ of a matrix having t rows and (t+1) columns, where $1 \leq i \leq t$, $1 \leq j \leq t+1$, $A_0$ to $A_{2t-1}$ represent syndromes or error positions, and by performing a left-hand elementary transformation over the matrix in order to obtain each coefficient of each term of the error position polynomial or error patterns from syndromes, comprising:

memory means having a bit width of (w×t) and t+1 addresses, each of said (t+1) addresses being in one to one correspondence with each column of said matrix, a coefficient calculating circuit having a first multiplying means for multiplying each coefficient in the error-position polynomial by each root in the error-position polynomial corresponding to each coefficient, and an integrating means for integrating sequentially each multiplied value of each coefficient and each root and for detecting whether an integrated value of each multiplied value is 0 or not, operations of said first multiplying means and said integrating means being repeated until the repeated number thereof is equal to the number of words in one correction sequence;

an error pattern calculating circuit having a second multiplying means for multiplying power of each of the error positions obtained on the basis of each of coefficient of the error-position polynomial by each root in the error-position polynomial corresponding to power of each of the error-positions in synchronization with the operation of said first multiplying means and said integrating means, and for writing each multiplied value of each root and power of each of the error positions in said memory means when said integrating means detects 0; and an error position calculating means for obtaining the error-positions by utilizing said coefficient calculating circuit of the error-position polynomial and said error pattern calculating circuit, said error position calculating means performing calculating operations in unit of each column by writing and reading in unit of each column a data word of each column of said matrix at each corresponding address position in said memory means.

* * * * *